(12) United States Patent
Franko

(10) Patent No.: US 7,363,559 B2
(45) Date of Patent: Apr. 22, 2008

(54) DETECTION OF TAP REGISTER CHARACTERISTICS

(75) Inventor: Jaemon D. Franko, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 215 days.

(21) Appl. No.: 11/322,919

(22) Filed: Dec. 30, 2005

(65) Prior Publication Data

US 2007/0157055 A1    Jul. 5, 2007

(51) Int. Cl.
*G01R 31/28* (2006.01)
(52) U.S. Cl. ...................... 714/724; 714/726
(58) Field of Classification Search ................ None
See application file for complete search history.

(56) References Cited

U.S. PATENT DOCUMENTS

| | | | |
|---|---|---|---|
| 4,860,191 A * | 8/1989 | Nomura et al. ............. 710/110 |
| 4,953,082 A * | 8/1990 | Nomura et al. ............... 712/25 |
| 5,630,052 A | 5/1997 | Shah |
| 5,974,180 A * | 10/1999 | Schwendeman ............ 382/232 |
| 6,819,140 B2 * | 11/2004 | Yamanaka et al. ............ 326/93 |
| 7,058,869 B2 * | 6/2006 | Abdel-Hafez et al. ....... 714/729 |
| 7,216,275 B2 * | 5/2007 | Liang ......................... 714/727 |
| 2005/0005217 A1 * | 1/2005 | Whetsel ...................... 714/727 |
| 2006/0073812 A1 * | 4/2006 | Punaganti Venkata et al. ... 455/412.1 |
| 2006/0075318 A1 * | 4/2006 | Romero et al. ............. 714/738 |

* cited by examiner

*Primary Examiner*—Phung My Chung
(74) *Attorney, Agent, or Firm*—Buckley, Maschoff & Talwalkar LLC (57) ABSTRACT

According to some embodiments, first data including a token is shifted into an IEEE 1149.1-compliant shift register and second data is received, the second data being shifted out from the IEEE 1149.1-compliant shift register as a result of the shifting of the first data. Next, it is determined whether the second data includes the token. In some aspects, a size of the IEEE 1149.1-compliant shift register is determined based on the second data.

16 Claims, 6 Drawing Sheets

DETECTION OF TAP REGISTER CHARACTERISTICS

BACKGROUND

The Institute of Electrical and Electronic Engineers (IEEE) standard 1149.1, "Standard Test Access Port and Boundary-Scan Architecture", provides a system to control and observe boundary pins of a compliant device. During such control and observation, input pin signals may be captured and output pin signals may be preset to test downstream devices. A compliant device includes a Test Access Port (TAP) controller and TAP registers for supporting the standard.

Improper functioning of the TAP registers may lead to ineffective testing of the compliant device. For example, a testing system may improperly evaluate data received from the TAP register if the TAP register corrupts data that is shifted through it. Additionally, if the actual length (i.e., bit size) of the TAP register is not equal to its expected length, any system acting on the output of the register may not function properly. Fabrication, design and/or documentation errors may increase the likelihood of either of these scenarios. Systems for efficiently detecting TAP register size and/or malfunctions are therefore desired.

DETAILED DESCRIPTION

Figure 1:
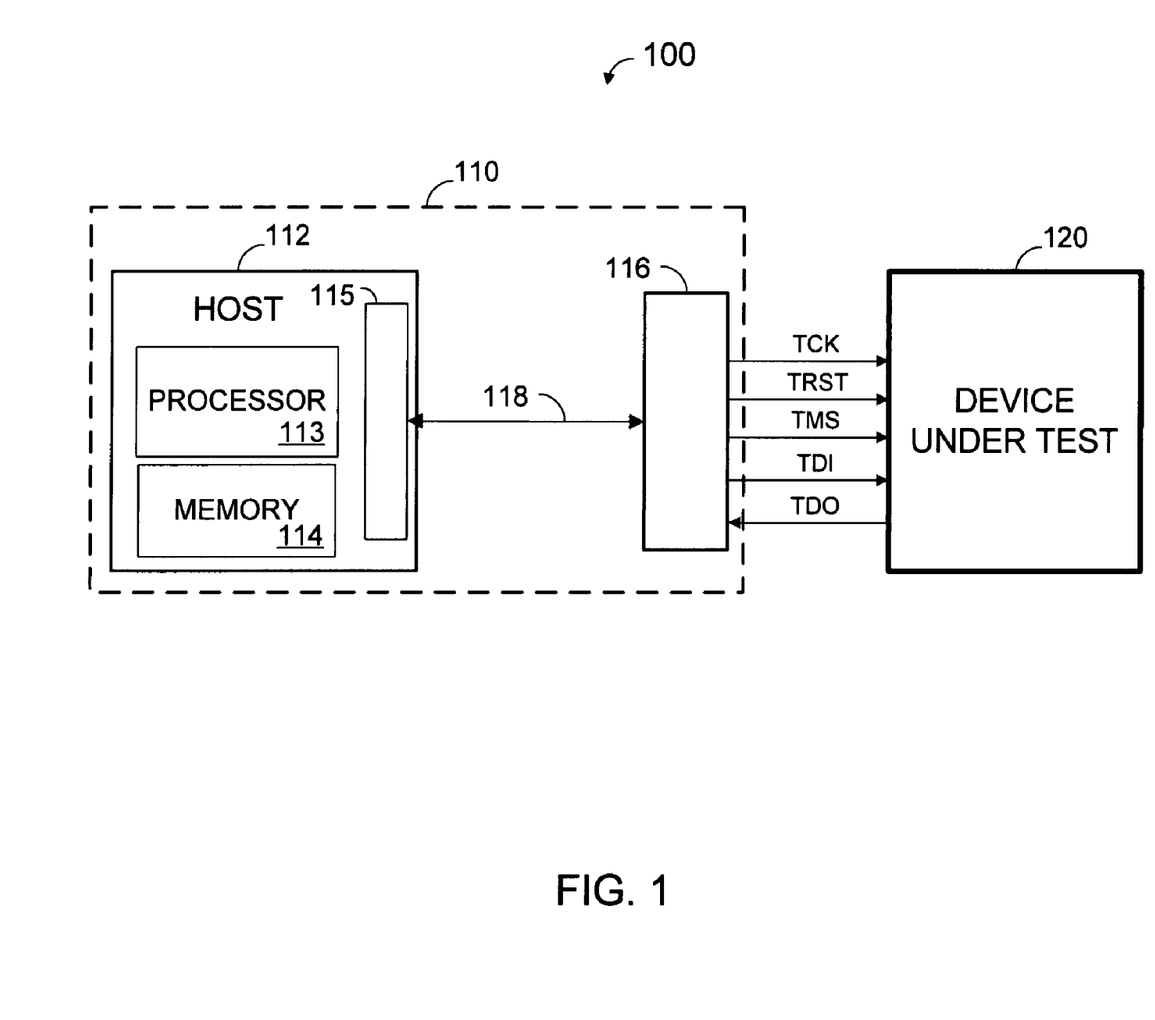
FIG. 1 is a diagram of a system according to some embodiments.

FIG. 1 is a block diagram of system 100 according to some embodiments. System 100 includes testing platform 110 and device under test (DUT) 120. Testing platform 110 may operate to debug and/or otherwise test DUT, 120. Testing platform 110 may comprise any combination of hardware and/or software elements, including elements located remotely from one another. As illustrated, such elements comprise host 112 and testing adapter 116.

Host 112 may comprise a desktop computer or any other suitable system to control a debug/test procedure. Host 112 includes processor 113, which comprises a Pentium®-class microprocessor in some embodiments, and memory 114, which may comprise any suitable memory element to store code for execution by processor 113. Such memory elements may include, but are not limited to, Single Data Rate Random Access Memory and Double Data Rate Random Access Memory. Execution of the code may cause platform 110 to perform actions attributed herein thereto.

Host 112 also includes interface board 115 for interfacing with testing adapter 116. According to some embodiments, interface board 115 comprises a Universal Serial Bus card and testing adapter 116 comprises an intelligent buffer board. In some embodiments, interface board 115 comprises a Peripheral Component Interconnect card and testing adapter 116 comprises an in-target probe. Interconnect 118 comprises any signal transfer media suitable for transferring signals between the particular interface board 115 and testing adapter 116.

Host 112 may also include unshown elements necessary for operation thereof. Such elements may include input devices, output devices, communication ports, hard drive storage, application software, operating system software, and device drivers. For example, host 112 may store a testing application for performing the methods described herein, and may store data received during the tests in an internal hard drive.

DUT 120 may comprise any device including but not limited to a microprocessor. DUT 120 is intended to be IEEE 1149.1-compliant, even if not strictly in compliance due to design errors, fabrication errors, functional flaws, and/or other factors. Such a DUT will be referred to as "IEEE 1149.1-compliant" for purposes of the present disclosure.

DUT 120 may include functional units such as a cache structure and an Arithmetic Logic Unit. DUT 120 includes a TAP controller and TAP registers for supporting the illustrated TAP signals and, more particularly, testing under IEEE 1149.1. The signal interface between testing adapter 116 and DUT 120 may include signals in addition to those illustrated.

In operation, processor 113 may execute code stored in memory 114 to shift first data including a token into a IEEE 1149.1-compliant shift register, to receive second data, the second data being shifted out from the shift register as a result of shifting the first data, and determine whether the second data includes the token. Some embodiments of the foregoing may provide efficient testing of the shift register's integrity and/or length.

Figure 2:
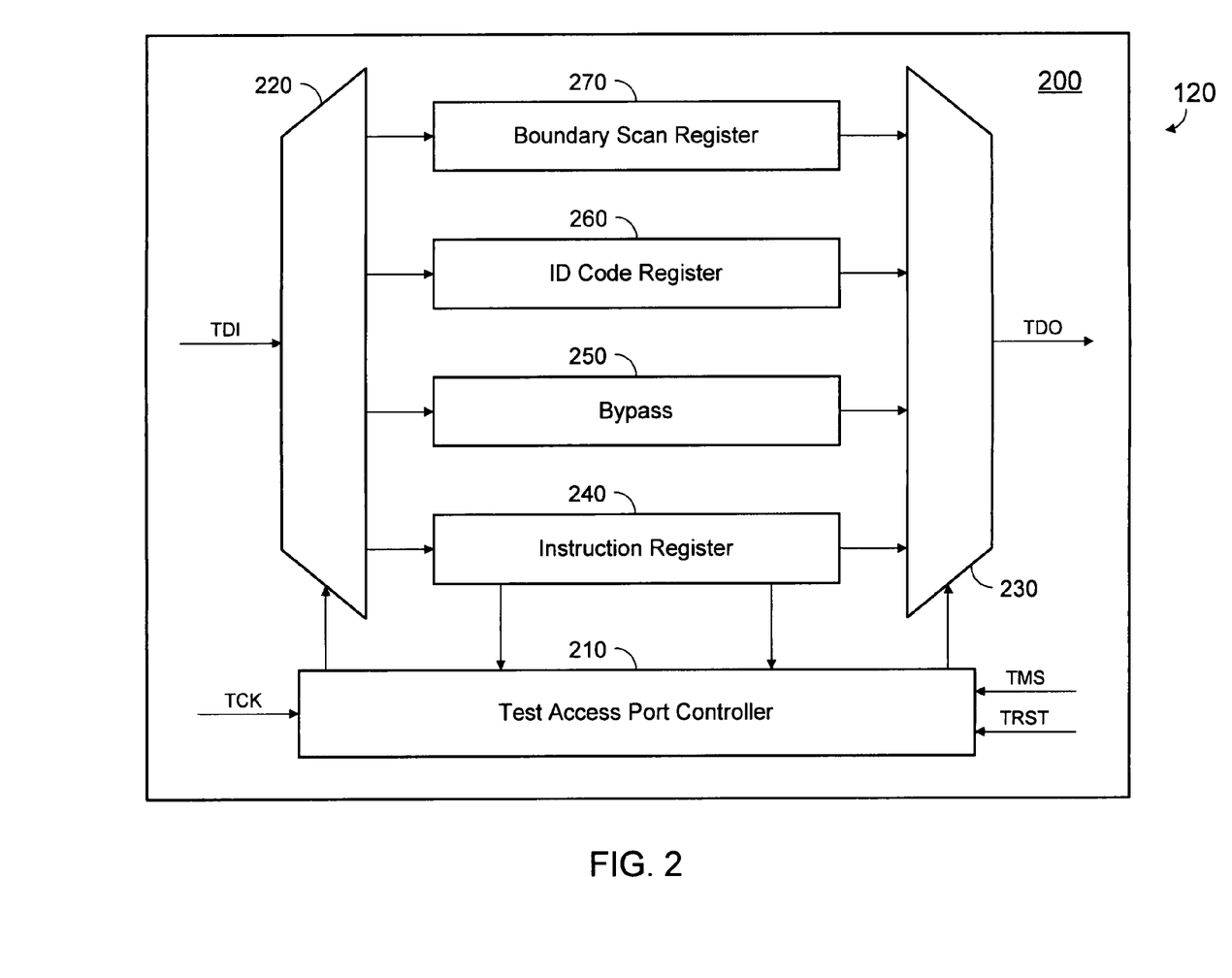
FIG. 2 is a block diagram of TAP hardware according to some embodiments.

FIG. 2 is a block diagram of TAP hardware 200 within DUT 120 according to some embodiments. TAP hardware 200 supports the TAP signals illustrated in FIG. 1. Specifically, TAP hardware 200 of FIG. 2 includes TAP controller 210 for receiving a TCK signal, a TMS signal and a TRST signal, input mux 220 for receiving a TDI signal, and demux 230 for outputting a TDO signal. Also included are instruction register 240, bypass register 250, ID code register 260, and boundary scan register 270. Registers 240 through 270 comprise shift registers according to some embodiments.

TAP controller 210 controls operation of TAP hardware 200. As shown, TAP controller 210 selects one of registers 240 through 270 to receive data supplied by the TDI signal, and selects one of registers 240 through 270 to serially output data via the TDO signal. For example, TAP controller 210 may select ID code register 260 using mux 220 and demux 230. As a result, the TDI signal shifts data into ID code register 260. Data that is shifted out of ID code register 260 as a result of shifting in the received data is carried by the TDO signal. As will be described with respect to FIG. 6, the "shifted out" data may be propagated to a next device in a TAP scan chain to which DUT 120 belongs.

TAP controller 210 may comprise a state machine whose state transitions are controlled by the TMS signal. The TCK signal received by TAP controller 210 controls the timing of TAP hardware 200 independently from any system clocks. The TRST signal resets TAP hardware 200 to a state that will not interfere with normal operation of all DUT 120. In operation, TAP controller 210 controls mux 220 to serially load instruction register 240 with an instruction specifying an operation to be performed, and an identifier of a data register on which the operation is to be performed. TAP controller 210 reads instruction register 240 and executes the operation.

Bypass register 250 may comprise a single cell pass-through register for connecting the TDI signal to the TDO signal with a one clock cycle delay. Bypass register 250 may thereby facilitate access to another device connected to the TAP scan chain of DUT 120. ID code register 260 may include an identification number that is hard-coded into DUT 120.

Boundary scan register 270 may comprise a serial scan path that intercepts signals passing between core logic and I/O pins of DUT 120. During normal operation of DUT 120, the pins are transparently connected to the core logic. During testing, and according to some embodiments, the core logic is disconnected from the I/O pins and data of boundary scan register 270 is used to read states of the input pins and to drive the output pins. Other testing scenarios may include disconnecting the core logic from the I/O pins, driving the input pins using data of boundary scan register 270, and reading the resulting outputs of the core logic.

Some embodiments include different, more, and/or fewer registers than shown in FIG. 2. Some of these unshown registers may comply with formal or informal industry standards, some may be fully documented, and/or still others may be proprietary and/or private.

Figure 3:
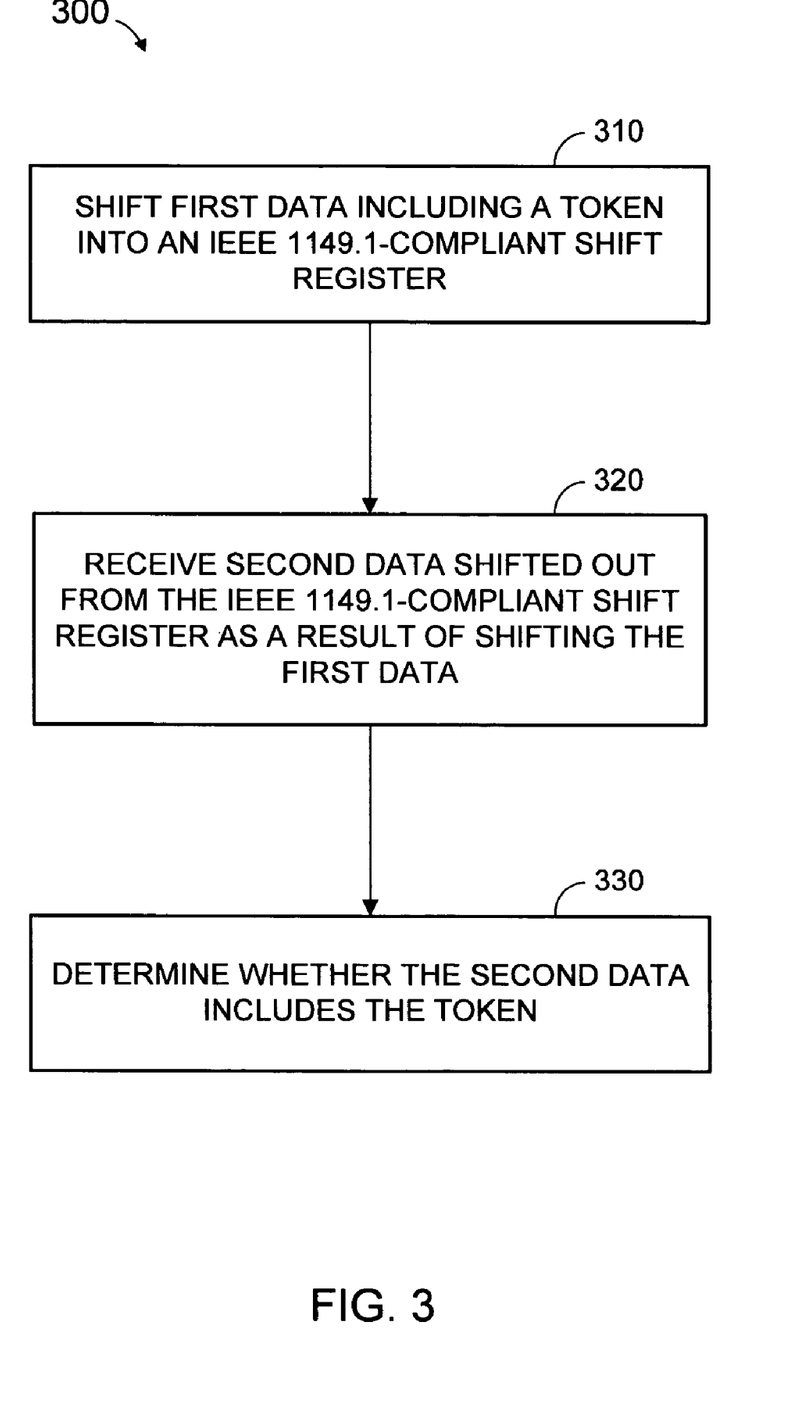
FIG. 3 is a flow diagram of a method according to some embodiments.

FIG. 3 is a general flow diagram of process 300 for evaluating an IEEE 1149.1-compliant register according to some embodiments. Process 300 may be performed by any suitable system according to some embodiments, including but not limited to testing platform 110. Process 300 may therefore be performed by any combination of hardware and/or software existing in any element of testing platform 110. Some embodiments of process 300 may be practiced in any order that is practicable.

Figure 4:
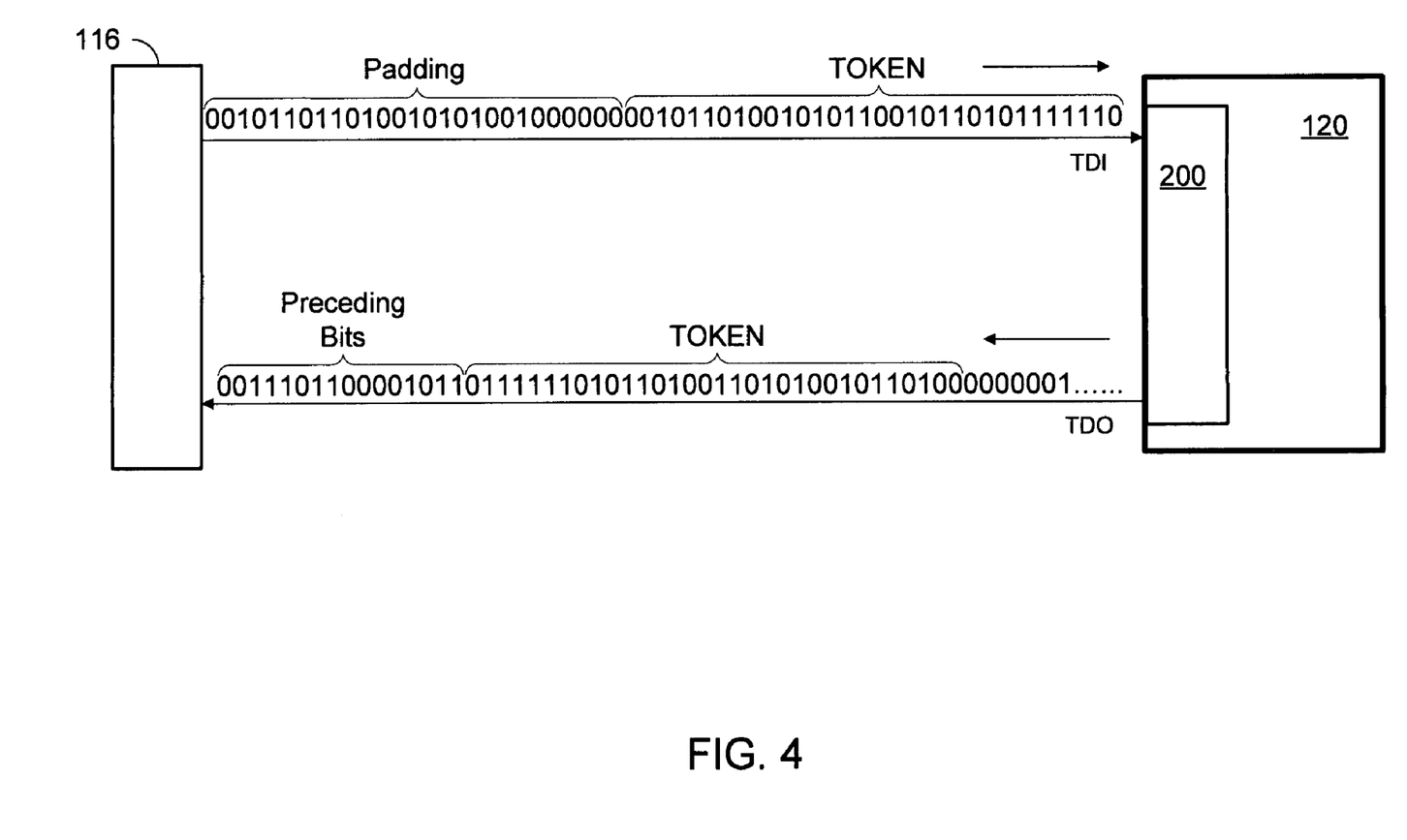
FIG. 4 is a block diagram illustrating shifting of data in and out of TAP hardware according to some embodiments.

Initially, at 310, first data including a token is shifted into an IEEE 1149.1-compliant shift register. FIG. 4 illustrates an example of 310 according to some embodiments. As shown, testing adapter 116 of testing platform 110 transmits a 32-bit token to TAP hardware 200 of DUT 120 via the TDI signal. The token may comprise any number of bits according to some embodiments. For example, a token in some embodiments may comprise a 64-bit sequence that is significantly unlikely to occur naturally.

Next, second data is received at 320. The second data comprises data that is shifted out from the IEEE 1149.1-compliant shift register as a result of the shifting of the first data into the shift register. As shown in FIG. 4, the second data may be received by adapter 116 via the TDO signal.

At 330, it is determined whether the second data includes the token. Processor 113 may execute program code from memory 114 to facilitate the determination of 330. Results of the determination may then be used to evaluate a size and/or integrity of the shift register. More specific examples of the foregoing will now be described with respect to FIG. 5.

Figure 5:
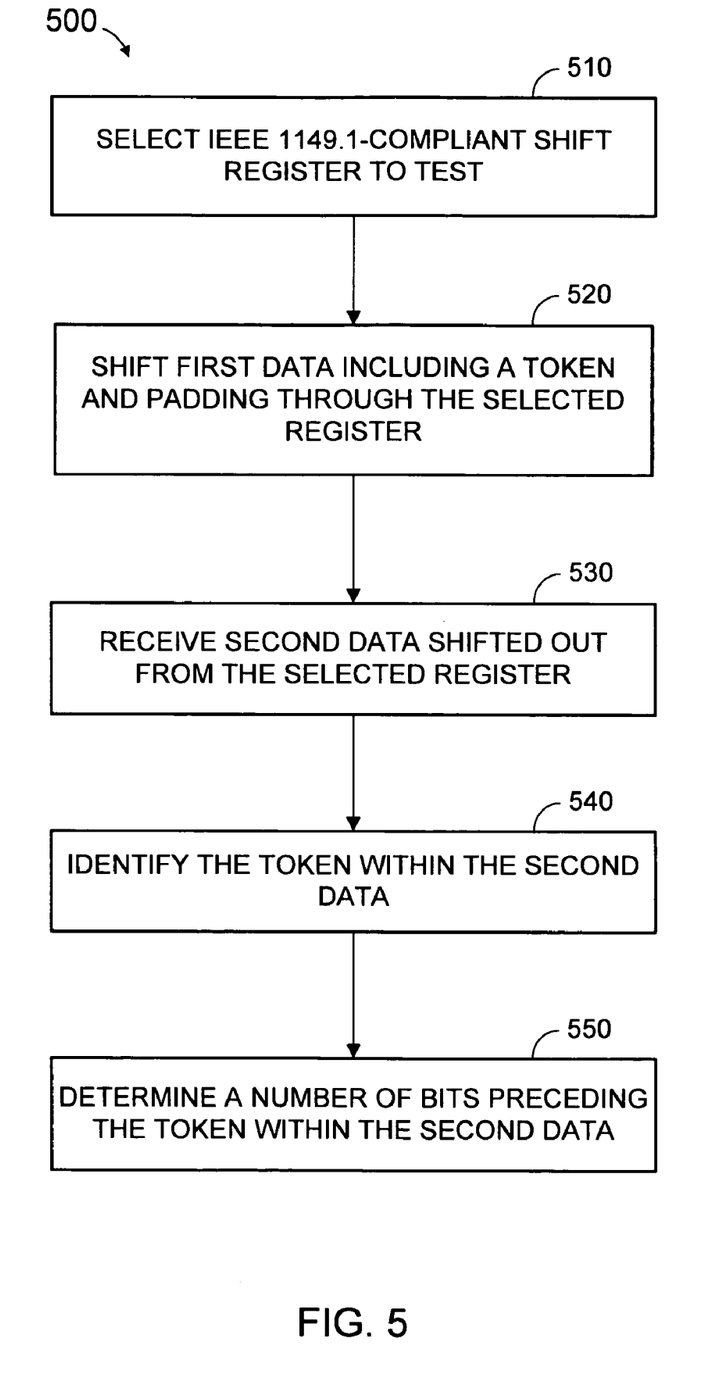
FIG. 5 is a flow diagram of a method according to some embodiments.

In this regard, FIG. 5 is a flow diagram of process 500 according to some embodiments. Process 500 may be performed by testing platform 110 according to some embodiments.

An IEEE 1149.1-compliant register is selected for testing at 510. The selected register is an element of an IEEE 1149.1-compliant device. As an example of 510 according to some embodiments, testing platform 110 may load instruction register 240 with an identifier of ID code register 260 using an IR_Scan command. In response, TAP controller 210 controls mux 220 to pass data received via the TDI signal to ID code register 260.

Next, at 520, first data including a token and padding is shifted into the selected shift register. As shown in FIG. 4, testing adapter 116 of testing platform 110 may transmit a 32-bit token via the TDI signal at 520. Referring back to the above example, the first data may be shifted into ID code register 260 using a DR_Scan command.

The first data shown in FIG. 4 includes padding bits transmitted after the token. The padding bits transmitted after the token are used to shift the token completely through the selected register. In this regard, TAP controller 210 may also control demux 230 at 510 to pass bits shifted out of ID code register 260 on to the TDO signal. According to some embodiments, padding bits are transmitted prior to the token as well.

Second data shifted out from the selected shift register is received at 530. The second data comprises data that is shifted on to the TDO signal as a result of shifting the first data into the selected shift register. Accordingly, the second data should include the token if the number of padding bits following the token is greater than a size of the selected register. The second data may be received by adapter 116 and in turn by host 112 via the TDO signal.

The token is identified within the second data at 540. Host 112 may identify the token by searching the received second data for a bit sequence identical to the token. According to some embodiments, host 112 identifies the token by searching the received second data for a bit sequence that is an inversion of the token. The latter embodiments may be particularly suitable to detecting a size of the selected register as well as a characteristic of the register to invert data shifted therethrough.

At 550, a number of bits preceding the token within the second data is determined. The determined number of bits may be equal to a size of the selected register. Accordingly, process 500 may be useful in determining and/or verifying a size of the selected IEEE 1149.1-compliant register.

According to some embodiments, the token (or its inversion) is not identified within the second data at 540 due to corruption of data occurring somewhere between the TDI pin and the TDO pin. In such a case, it may be determined that the selected register is faulty.

Some embodiments may identify the token within the second data at 540 even if the identified token is not bit-identical to the transmitted token (i.e., corrupted). Such identification of a corrupted token may allow testing platform 110 to determine how TAP hardware 200 corrupts incoming data and to generate alternative testing procedures (i.e., "workarounds") that account for the corruption.

Figure 6:
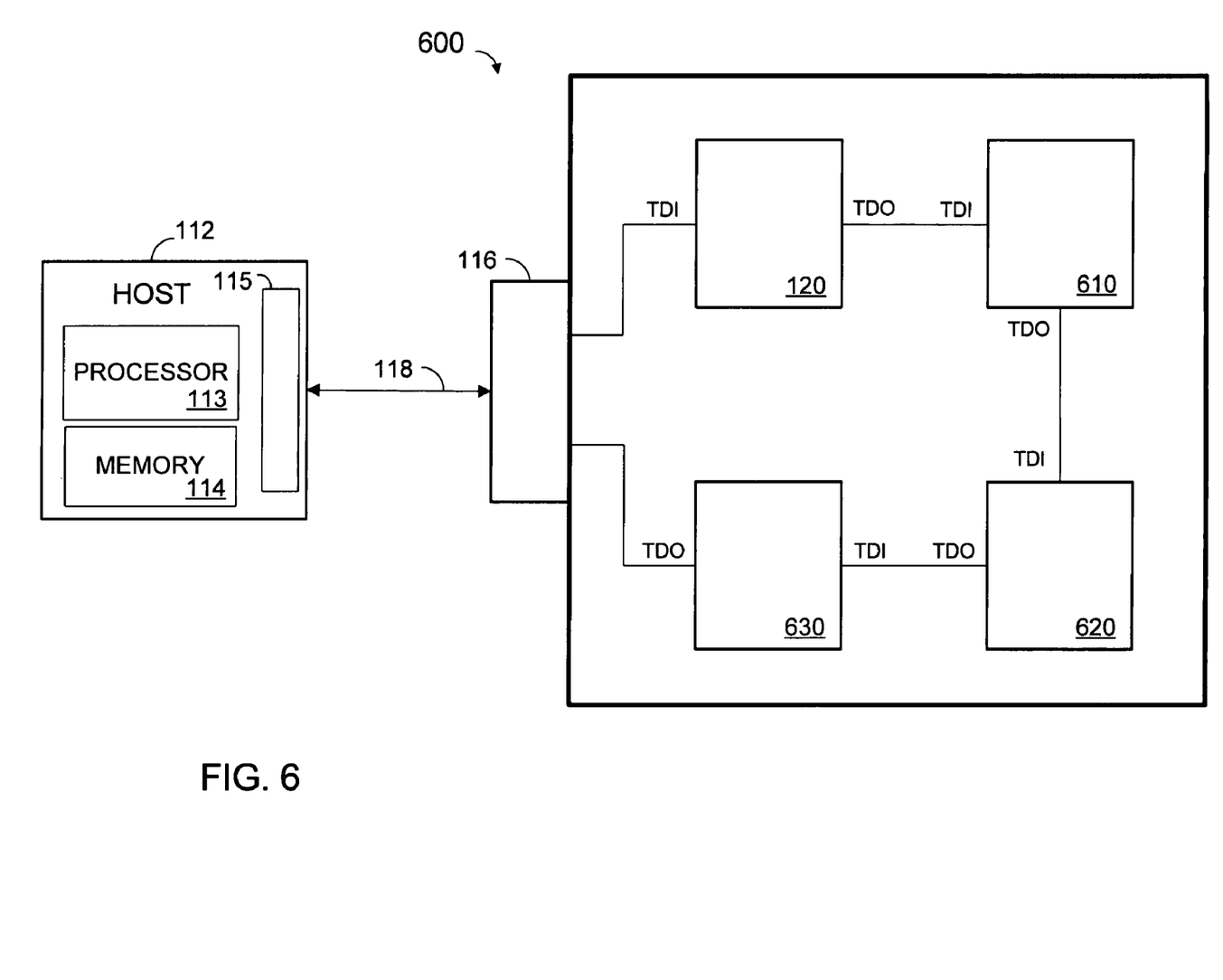
FIG. 6 is a diagram of a system according to some embodiments.

As mentioned above, DUT 120 may be just one device in a scan chain comprised of several IEEE 1149.1-compliant devices. FIG. 6 is a block diagram illustrating such a scenario according to some embodiments.

System 600 is identical to system 100 except for the addition of compliant devices 610 through 630. As shown, the TDO pin of DUT 120 is connected to the TDI pin of device 610, the TDO pin of device 610 is connected to the TDI pin of device 620, the TDO pin of device 620 is connected to the TDI pin of device 630, and the TDO pin of device 630 is connected to adapter 116. Techniques for routing the remaining TAP signals are known in the art, and such routing is unshown for purposes of clarity.

Process 500 may be used to determine information regarding the scan chain shown in FIG. 6. For example, at 510, a register of device 610 may be selected as well as registers of known length (such as a one-bit Bypass register) in each of devices 120, 620 and 630. The size of the selected register of device 610 may then be calculated as equal to the number of bits determined at 550 minus the total length of the selected registers of devices 120, 620 and 630 (i.e., three bits, assuming that a one-bit Bypass register was selected in each device). In addition, the contents shifted out of the selected register of device 610 will be located in the received second data from the third received but through two bits prior to the token (i.e., again assuming that a one-bit Bypass register was selected in each device).

According to some embodiments of process 500, if a size of the selected shift register is known or otherwise predetermined, host 112 may divide the number of bits determined at 550 by the predetermined size to determine a number of devices in the scan chain. This example assumes that respective TAP controllers of each of devices 120 and 610 through 630 have selected compliant registers of the predetermined size at 510.

If a size of the selected shift register is not known prior to process 500, host 112 may divide the number of bits determined at 550 by the number of devices in the scan chain to determine a size of the selected register. This alternative assumes that respective TAP controllers of each of devices 120 and 610 through 630 have selected compliant registers of equal size at 510.

The several embodiments described herein are solely for the purpose of illustration. Persons in the art will recognize from this description that other embodiments may be practiced with modifications and alterations limited only by the claims.

What is claimed is:

1. A method comprising:
    shifting first data including a token into an IEEE 1149.1-compliant shift register;
    receiving second data, the second data being shifted out from the IEEE 1149.1-compliant shift register as a result of shifting the first data;
    determining whether the second data includes the token; and
    if the second data includes the token then, determining a size of the IEEE 1149.1-compliant shift register based on the second data, wherein determining the size comprises:
        identifying the token within the second data; and
        determining a number of bits preceding the token within the second data.

2. A method according to claim 1, wherein identifying the token within the second data comprises:
    identifying an inversion of the token within the second data.

3. A method according to claim 1, wherein determining whether the second data includes the token comprises:
    determining whether the second data includes an inversion of the token.

4. A method according to claim 1, wherein determining whether the second data includes the token comprises identifying the token within the second data, and further comprising:
    dividing the number of bits by a predetermined size of the IEEE 1149.1-compliant shift register to determine a number of IEEE 1149.1-compliant devices in a scan chain including the IEEE 1149.1-compliant shift register.

5. A method according to claim 1, wherein determining whether the second data includes the token comprises identifying the token within the second data, and further comprising:
    dividing the number of bits by a predetermined number of IEEE 1149.1-compliant devices in a scan chain including the IEEE 1149.1-compliant shift register to determine a size of the IEEE 1149.1-compliant shift register.

6. A method according to claim 1, wherein identifying the identifier within the second data comprises:
    identifying corruption of the identifier within the second data.

7. An apparatus comprising:
    a memory storing executable code; and
    a processor operable in conjunction with the code to:
        shift first data including a token into an IEEE 1149.1-compliant shift register;
        receive second data, the second data being shifted out from the IEEE 1149.1-compliant shift register as a result of shifting the first data; and
        determine whether the second data includes the token; and
        if the second data includes the token then, determining a size of the IEEE 1149.1-compliant shift register based on the second data, wherein determining the size comprises:
            identifying the token within the second data; and
            determining a number of bits preceding the token within the second data.

8. An apparatus according to claim 7, wherein identification of the token within the second data comprises:
    identification of an inversion of the token within the second data.

9. An apparatus according to claim 7, wherein determination of whether the second data includes the token comprises:
    determination of whether the second data includes an inversion of the token.

10. An apparatus according to claim 7, wherein determination of whether the second data includes the token comprises identification of the token within the second data, and wherein the processor is further operable in conjunction with the code to:
    divide the number of bits by a predetermined size of the IEEE 1149.1-compliant shift register to determine a number of IEEE 1149.1-compliant devices in a scan chain including the IEEE 1149.1-compliant shift register.

11. An apparatus according to claim 7, wherein determination of whether the second data includes the token comprises identification of the token within the second data, and wherein the processor is further operable in conjunction with the code to:
    divide the number of bits by a predetermined number of IEEE 1149.1-compliant devices in a scan chain including the IEEE 1149.1-compliant shift register to determine a size of the IEEE 1149.1-compliant shift register.

12. An apparatus according to claim 7, wherein identification of the identifier within the second data comprises:
    identification of corruption of the identifier within the second data.

13. A system comprising:
    a microprocessor under test including at least one IEEE 1149.1-compliant shift register;
    a microprocessor testing adapter coupled to the microprocessor under test; and
    a host system comprising:
        a Universal Serial Bus-compliant port coupled to the microprocessor testing adapter;
        a memory storing executable code; and
        a processor operable in conjunction with the code to:
            shift first data including a token into the IEEE 1149.1-compliant shift register;

receive second data, the second data being shifted out from the IEEE 1149.1-compliant shift register as a result of shifting the first data; and determine whether the second data includes the token; and if the second data includes the token then, determine a size of the IEEE 1149.1-compliant shift register based on the second data, wherein determining the size comprises:

identifying the token within the second data; and determining a number of bits preceding the token within the second data.

14. A system according to claim 13, wherein identification of the token within the second data comprises:

identification of an inversion of the token within the second data.

15. A system according to claim 13, wherein determination of whether the second data includes the token comprises:

determination of whether the second data includes an inversion of the token.

16. A system according to claim 13, wherein identification of the identifier within the second data comprises:

identification of corruption of the identifier within the second data.

* * * * *